US012648093B2

(12) United States Patent     (10) Patent No.:    US 12,648,093 B2

Yu          (45) Date of Patent:      Jun. 2, 2026

(54) DISPLAY DEVICE AND CONTROL METHOD THEREFOR

(71) Applicant: HYUNDAI MOBIS CO., LTD., Seoul (KR)

(72) Inventor: Byung Mo Yu, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 366 days.

(21) Appl. No.: 18/329,641

(22) Filed: Jun. 6, 2023

(65) Prior Publication Data

US 2024/0064915 A1     Feb. 22, 2024

(30) Foreign Application Priority Data

Aug. 19, 2022    (KR) ........................ 10-2022-0103872

(51) Int. Cl.
    *H05K 5/02*        (2006.01)
(52) U.S. Cl.
    CPC ................................. *H05K 5/0217* (2013.01)

(58) Field of Classification Search
    CPC ..................................................... H05K 5/0217
    See application file for complete search history.

(56) References Cited

U.S. PATENT DOCUMENTS

| | | | |
|---|---|---|---|
| 2019/0041652 A1* | 2/2019 | Murayama ............. | B60K 35/53 |
| 2024/0048025 A1* | 2/2024 | Cho .......................... | H02P 1/22 |

FOREIGN PATENT DOCUMENTS

KR       10-0821925 B1     4/2008

\* cited by examiner

*Primary Examiner* — Robert J Michaud
(74) *Attorney, Agent, or Firm* — NovoTechIP International PLLC

(57) ABSTRACT

A display device and a control method therefor are provided. The display device includes a casing having an opening, a display configured to be inserted into or withdrawn from the casing through the opening, a motor gear assembly connected to the display to move the display, and a sensor configured to measure a distance between the display and an inner wall of the casing. Movement of the display is controlled based on values measured by the sensor.

19 Claims, 10 Drawing Sheets

First Mode       Second Mode       Third Mode       N-th Mode

120 —

110 —

First Mode          Second Mode          Third Mode          N-th Mode

First Mode

Second Mode

Third Mode

Fourth Mode

DISPLAY DEVICE AND CONTROL METHOD THEREFOR

CROSS-REFERENCE TO RELATED APPLICATIONS

Pursuant to 35 U.S.C. § 119(a), this application claims the benefit of an earlier filing date and right of priority to Korean Application No. 10-2022-0103872, filed on Aug. 19, 2022, the contents of which are hereby incorporated by reference herein in their entirety.

TECHNICAL FIELD

The present embodiments relate to a display device and a control method therefor and, more particularly, to a display device in which a withdrawal range of a display inserted into a casing is controllable, and a control method therefor.

BACKGROUND

A display device may be used for numerous devices as a device capable of displaying various visual information on a display. In particular, a center fascia display of a vehicle displays various visual information about the vehicle. A display device in a vehicle may be installed on a dashboard of the vehicle disposed in front of a driver seat and a passenger seat to display various convenience information, such as navigation, vehicle management, manipulation, Internet, and entertainment information.

Regarding display devices, a movable display device may move up and down or left and right relative to a dashboard. As a display moves along a guide, a driver and a front passenger of a vehicle may selectively use the display. In a pop-up display device, a display may remain accommodated in a space and then be withdrawn out of the space when necessary.

A conventional pop-up display provides only two modes, i.e., accommodation of the display or full exposure of the display, and thus utilization thereof is not great. In addition, the pop-up display requires appropriate control of a withdrawal range of the display, but it is difficult to accurately control the withdrawal range of the display by control of the number of rotations of a motor due to a non-uniform input voltage.

Therefore, a display device having a shape and structure capable of gaining advantages while minimizing these disadvantages needs to be developed. For background art related thereto, refer to Korean Patent No. 10-0821925 ("Apparatus for driving display").

SUMMARY

An object of embodiments of the present disclosure is to provide a display device capable of controlling a withdrawal mode of a display.

Another object of embodiments of the present disclosure is to provide a display device with improved control accuracy of a withdrawal mode of a display.

Another object of embodiments of the present disclosure is to provide a method of efficiently controlling a withdrawal mode of a display.

The objects to be achieved by the present disclosure are not limited to what has been particularly described hereinabove and other objects not described herein will be more clearly understood by persons skilled in the art from the following detailed description.

To achieve these objects and other advantages and in accordance with the purpose of the disclosure, as embodied and broadly described herein, a display device includes a casing having an opening, a display configured to be inserted into or withdrawn from the casing through the opening, a motor gear assembly connected to move the display, and a sensor configured to measure a distance between the display and an inner wall of the casing. Movement of the display is controlled based on values measured by the sensor.

The sensor may be disposed on the display and measure a distance to one point on the inner wall of the casing in a direction parallel to a movement direction of the display.

The sensor may be disposed on the inner wall of the casing and measure a distance to one point on the display in a direction parallel to a movement direction of the display.

The display may be withdrawable from the casing according to a plurality of withdrawal modes having different withdrawal ranges, the plural withdrawal modes may correspond to ranges of values measured by the sensor, respectively, and a withdrawal mode of the display may be determined based on the values measured by the sensor.

The sensor may be disposed on a rear surface of the display and configured to measure a distance in a direction perpendicular to a movement direction of the display, the inner wall of the casing may include a mode control structure having a shape along which a horizontal distance to the sensor gradually changes, and the sensor may measure a distance between the rear surface of the display and the mode control structure.

The sensor may be disposed on the inner wall of the casing and measure a distance in a direction perpendicular to a movement direction of the display, a rear surface of the display may include a mode control structure having a shape along which a horizontal distance to the sensor gradually changes, and the sensor may measure a distance between the inner wall of the casing and the mode control structure.

The display may be withdrawable from the casing according to a plurality of withdrawal modes having different withdrawal ranges, the plurality of withdrawal modes corresponding to values measured by the sensor, respectively, and a withdrawal mode of the display may be determinable based on the values measured by the sensor.

The sensor may be disposed on a rear surface of the display and configured to measure a distance in a direction perpendicular to a movement direction of the display, the inner wall of the casing may include a mode control structure having a shape along which a horizontal distance to the sensor continuously changes, and the sensor may measure a distance between the rear surface of the display and the mode control structure.

The sensor may be disposed on the inner wall of the casing and measure a distance in a direction perpendicular to a movement direction of the display, a rear surface of the display may include a mode control structure having a shape along which a horizontal distance to the sensor continuously changes, and the sensor may measure a distance between the inner wall of the casing and the mode control structure.

The display may be withdrawable from the casing according to a plurality of withdrawal modes having different withdrawal ranges, the plurality of withdrawal modes corresponding to ranges of values measured by the sensor, respectively, and a withdrawal mode of the display may be determinable or determined based on the values measured by the sensor.

In another aspect of the present disclosure, a vehicle including the display device is provided. The display device is mounted on a center fascia or a dashboard of the vehicle.

In another aspect of the present disclosure, a display device is provided. The display device may measure, using a sensor, a distance between a moveable display and a casing of the display device, the distance changing according to withdrawal of the display from the casing and a withdrawal range of the display by checking a degree of withdrawal of the display based on values measured by the sensor.

In another aspect of the present disclosure, a method of controlling the display device is provided. The method includes checking a position of the display based on the values measured by the sensor, receiving a mode signal initiated by a user, driving a motor based on the mode signal initiated by the user, and determining whether the display has been moved according to the mode signal initiated by the user based on the values measured by the sensor.

According to any one of embodiments of the present disclosure, a variety of modes for a display may be selected, such that utilization of a display device may be increased.

Further, according to any one of embodiments of the present disclosure, a withdrawal mode of a display may be precisely controlled with a simple configuration.

Furthermore, according to any one of embodiments of the present disclosure, a withdrawal mode of a display may be controlled using an efficient method.

The effects that are achievable by the present disclosure are not limited to what has been particularly described hereinabove and other advantages not described herein will be more clearly understood by persons skilled in the art from the following description.

DETAILED DESCRIPTION

Advantages and features of the present disclosure and methods to achieve the same will be apparent from the following detailed description of embodiments taken in conjunction with the accompanying drawings. The present disclosure may, however, be implemented in various different ways and should not be construed as being limited to the embodiments disclosed hereinbelow. Rather, the present embodiments are provided so that this disclosure will be through and complete, and will fully convey the concepts of the present disclosure to those of ordinary skill in the art, and the present disclosure is only defined by the accompanying claims and equivalents thereto.

The terms used in the present specification are used in order to describe embodiments, but are not intended to limit the scope of the present disclosure. As used in the present specification, a singular form may also include a plural form, unless otherwise defined contextually. Moreover, the terms "comprise", "include", or "have" used in this specification specify the presence of stated elements but do not preclude the presence or addition of one or more other elements. Like numbers refer to like elements throughout the specification. As used herein, the term "and/or" includes each and all combinations of one or more of elements mentioned. The terms such as "first" or "second" are used in order to describe a variety of elements, but it is apparent that such elements should not be limited to the scope of terms. The terms are used solely for the purpose of distinguishing one element from another. Accordingly, it is apparent that a first element mentioned hereinbelow could be termed a second element, without departing from the scope of the present disclosure.

Unless otherwise defined, all terms (including technical and scientific terms) used herein have the same meaning as commonly understood by one of ordinary skill in the art to which the present disclosure belongs. Terms, such as those defined in commonly used dictionaries, are not to be interpreted in an idealized or overly formal sense unless expressly so defined herein.

Spatially relative terms, such as "below", "beneath", "lower", "above", "upper", and the like, may be used herein to easily describe the correlation between one element and another element as illustrated in the figures. The spatially relative terms should be understood as encompassing different orientations of elements in additional usage or operation of the orientations illustrated in figures. For example, when an element illustrated in the figures is turned over, the element described as disposed "below" or "beneath" another element may be disposed "above" the other element. Accordingly, the exemplary term "below" or "beneath" may encompass orientations of both below and above. The element may be oriented in other orientations, and the spatially relative terms used herein may be interpreted accordingly.

Figure 1:
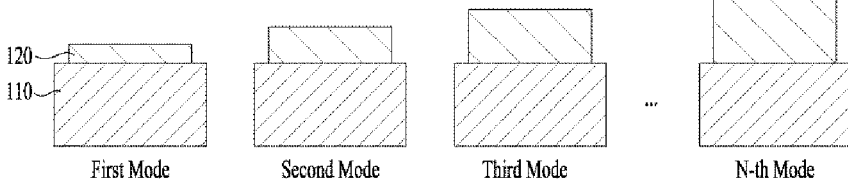
FIG. 1 illustrates a withdrawal mode of a display device according to an embodiment of the present disclosure.

FIG. 1 illustrates a withdrawal mode of a display device according to an embodiment of the present disclosure (referred to hereinafter as a "display device").

Referring to FIG. 1, the display device may include a display 120 which is withdrawable from a casing 110 according to a plurality of withdrawal modes. For example, in a first mode, about ¼ of the display 120 may be withdrawn from the casing 110, and in a fourth mode, the display 120 may be fully withdrawn from the casing 110. The number of withdrawal modes and an exposure range of the display 120 corresponding to each withdrawal mode may be appropriately designed by a person skilled in the art.

The display device may effectively utilize the display 120 by properly withdrawing the display 120 according to selection of a user. For example, when a small amount of information is displayed on a screen of the display 120, the display 120 may be withdrawn a little. When a large amount of information is displayed on the screen of the display 120, for example, when navigation, gaming, etc. are displayed on the screen of the display 120, the display 120 may be withdrawn a lot. Since the display 120 is capable of being withdrawn in consideration of the amount or usage of information displayed on the display 120, the display device may improve user convenience and reduce power consumed to output information on the screen.

Figure 2:
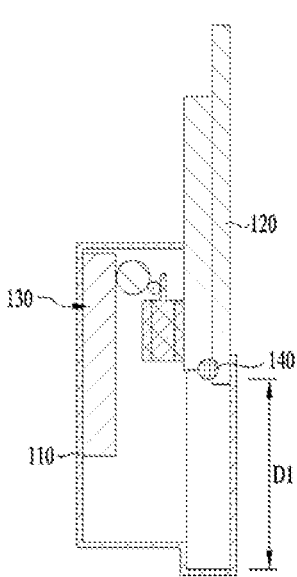
FIG. 2 is a side view illustrating the inside of a display device according to a first embodiment of the present disclosure.

FIG. 2 is a side view illustrating the inside of a display device according to a first embodiment of the present disclosure. FIG. 2 illustrates components included in the display device to control a movement range of the display 120 according to a withdrawal mode. The components in the drawing are schematically illustrated to aid in understanding embodiments of the present disclosure.

Referring to FIG. 2, the display device includes a casing 110 having an opening through which the display 120 is inserted into and withdrawn from the casing 110, a display 120 that is movable to the inside or outside of the casing 110 through the opening, a motor gear assembly 130 connected to the display 120 to move the display 120, and/or a sensor 140 that measures the distance between the display 120 and an inner wall of the casing 110.

The casing 110 has an internal space for accommodating the display 120 and has the opening that allows the display 120 to enter the internal space and exit from the internal space therethrough.

The display 120 may be externally withdrawn from the casing 110 or internally inserted into the casing 110, through the opening of the casing 110. The display 120 may output various information on a screen thereof and may be formed of a combination of various parts related thereto. In the drawing, the right side is the front side of the display 120 on which the screen of the display 120 is disposed.

The motor gear assembly 130 transmits the power of a motor to move the display 120. The motor gear assembly 130 may include the motor and various gears (a worm gear, a worm wheel, a spur gear, a rack gear, etc.) connected to the motor. The motor gear assembly 130 may be connected to the display 120 to slidably move the display 120 along a straight line. As illustrated in FIG. 2, the display 120 may move along a straight line in an upward and downward direction by driving of the motor gear assembly 130. Various connection schemes may be applied to a connection structure between the motor and the gears of the motor gear assembly 130 and to a connection structure between the motor and the display 120 by those skilled in the art.

The sensor 140 may measure the distance between the display 120 and an inner wall of the casing 110. The sensor may include sensors known in the art, such as an ultrasonic sensor, an infrared sensor, a lidar sensor, a radar sensor, a camera sensor, etc.

The sensor 140 may be disposed on (i.e., connected to one point on) the display 120 and measure the distance to one point on the inner wall of the casing 110 by generating a signal in a direction parallel to a movement direction of the display 120. For example, in FIG. 2, the sensor 140 may be connected to a lower end of the display 120 and measure a distance D1 to the inner wall of the lower part of the casing 110 in a direction parallel to the movement direction (vertical direction) of the display 120.

When the display 120 moves up and down, the value of the distance D1 measured by the sensor 140 changes. Accordingly, movement of the display 120 may be controlled based on values measured by the sensor 140. For example, an integrated controller (or head unit) of a vehicle may control a withdrawal range of the display 120 by controlling driving of the motor according to the values measured by the sensor 140 based on a withdrawal mode signal according to selection of a user.

Figure 3:
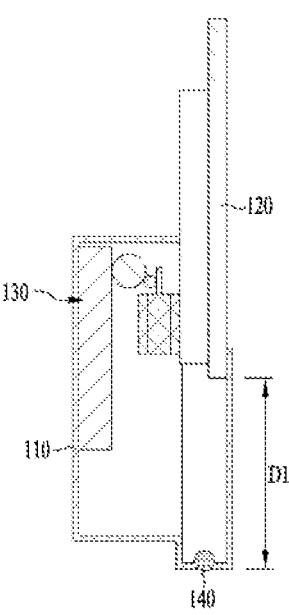
FIG. 3 is a side view illustrating the inside of the display device according to a second embodiment of the present disclosure.

FIG. 3 is a side view illustrating the inside of a display device according to a second embodiment of the present disclosure. It should be noted that in different embodiments, like reference numerals has been used to represent like elements. In the display device according to the second embodiment, the sensor 140 is connected to the inner wall of the casing 110 and measures the distance to one point on the display 120 in a direction parallel to the movement direction of the display 120.

For example, in FIG. 3, the sensor 140 is connected to the inner wall of the lower part of the casing 110 and measures the distance D1 to one point on the lower end of the display 120 in a vertical direction, which is the movement direction of the display 120. Therefore, the values measured by the sensor 140 vary as the display 120 moves up and down, and the movement of the display 120 may be controlled based on the values measured by the sensor 140.

In the display device according to the first or second embodiment, the display 120 may be withdrawn according to a plurality of withdrawal modes. The withdrawal modes have different withdrawal ranges of the display 120, respectively.

The withdrawal modes may correspond to ranges of the values measured by the sensor 140, respectively. For example, a first mode may correspond to the case in which a value measured by the sensor 140 is 0 mm to 50 mm, a second mode may correspond to the case in which the value measured by the sensor 140 is 50 mm to 100 mm, a third mode may correspond to the case in which the value measured by the sensor 140 is 100 mm to 150 mm, and a fourth mode may correspond to the case in which the value measured by the sensor 140 is 150 mm to 200 mm. Therefore, when the value measured by the sensor 140 is 120 mm, the withdrawal mode of the display 120 may be determined to be the third mode. The number of withdrawal modes and the ranges of the measured values corresponding thereto according to an embodiment may be arbitrarily set.

Figure 4:
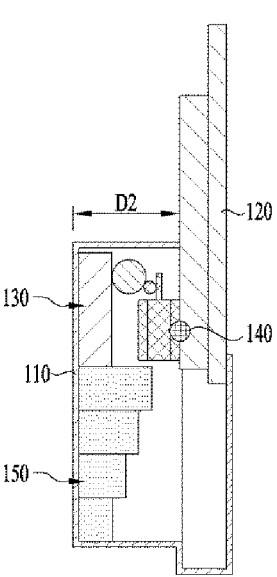
FIG. 4 is a side view illustrating the inside of a display device according to a third embodiment of the present disclosure.

FIG. 4 is a side view illustrating the inside of a display device according to a third embodiment of the present disclosure. Like reference numerals are used to represent like elements.

Referring to FIG. 4, the sensor 140 is connected to a rear surface of the display 120 and measures a distance in a direction perpendicular to a movement direction of the display 120 (a vertical direction in the drawing). That is, the sensor 140 may measure a distance D2 to the inner wall of the casing 110 in a direction perpendicular to the rear surface of the display 120. In this case, the inner wall of the casing 110 includes a mode control structure 150 with a shape along which the distance D2 measured according to the movement of the display 120 changes gradually. The distance D2 represents a horizontal distance between the sensor 140 located on the rear surface of the display 120 and the mode control structure 150. The sensor 140 may measure the distance between the rear surface of the display 120 and the mode control structure 150.

Referring to FIG. 4, the mode control structure 150 has a stepped shape. The mode control structure 150 includes a plurality of planes, and a measured vertical distance between each plane and the sensor 140 is different.

Figure 6:
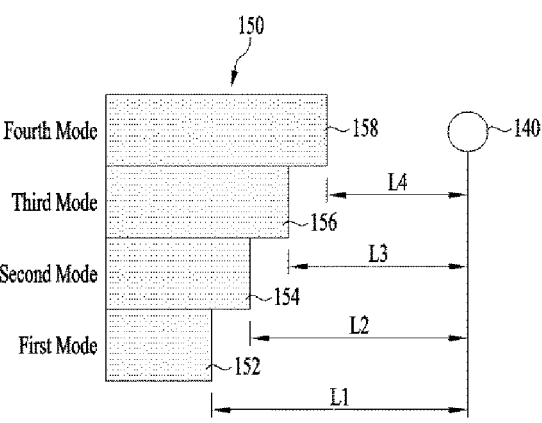
FIG. 6 illustrates a sensor and a mode control structure according to an embodiment of the present disclosure.

FIG. 6 illustrates the sensor 140 and the mode control structure 150 according to an embodiment of the present disclosure. Referring to FIG. 6, horizontal distances L1, L2, L3, and L4 between the sensor 140 and planes 152, 154, 156, and 158 of the mode control structure 150 are illustrated. Each plane may correspond to a withdrawal mode. For example, the plane 152 may correspond to a first mode.

When the distance between the sensor 140 and the mode control structure 150 is L1, the value measured by the sensor 140 is L1, and the withdrawal mode of the display 120 may be determined to be the first mode. Likewise, when the value measured by the sensor 140 is L2, the withdrawal mode of the display 120 may be determined to be the second mode.

Figure 5:
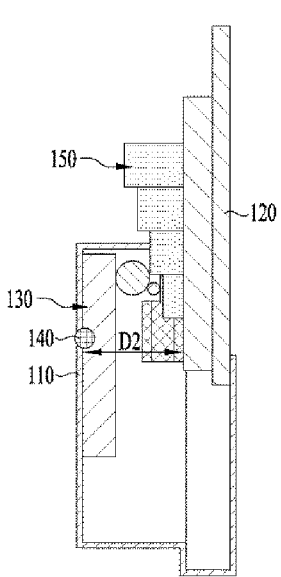
FIG. 5 is a side view illustrating the inside of a display device according to a fourth embodiment of the present disclosure.

FIG. 5 is a side view illustrating the inside of a display device according to a fourth embodiment of the present disclosure. Like reference numerals are used to represent like elements.

Referring to FIG. 5, the sensor 140 is connected to the inner wall of the casing 110, facing a rear surface of the display 120, and measures a distance to the rear surface of the display 120 in a direction perpendicular to a movement direction of the display 120. In this case, the rear surface of the display 120 includes the mode control structure 150 having a shape along which a horizontal distance to the sensor 140 changes gradually. The sensor 140 measures a distance D2 between the inner wall of the casing 110 and the mode control structure 150 of the rear surface of the display 120.

The display device may check the degree of withdrawal of the display 120 based on the value measured by the sensor 140 in the same manner as described in the fourth embodiment.

In the display device according to the fourth or fifth embodiment, the display 120 may be withdrawn according to a plurality of withdrawal modes having different withdrawal ranges. The withdrawal modes correspond to the values measured by the sensor 140, respectively. Therefore, a withdrawal mode of the display 120 may be determined based on the value measured by the sensor 140. For example, in FIG. 6, when the value measured by the sensor 140 is L3, the display 120 may be determined to be in the third mode.

Figure 7:
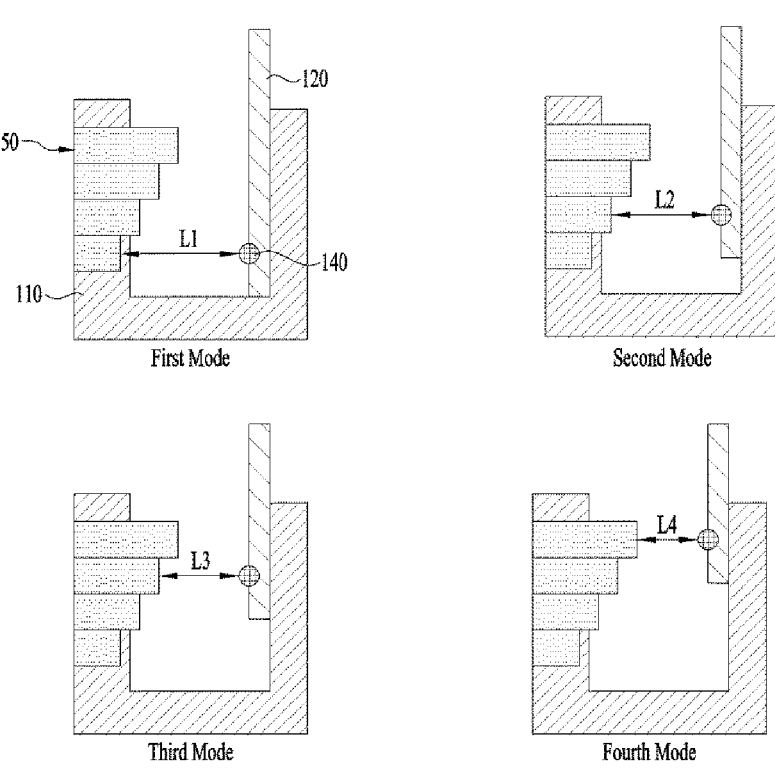
FIG. 7 illustrates the state of the display device in each mode according to the third embodiment of the present disclosure.
Figure 8:
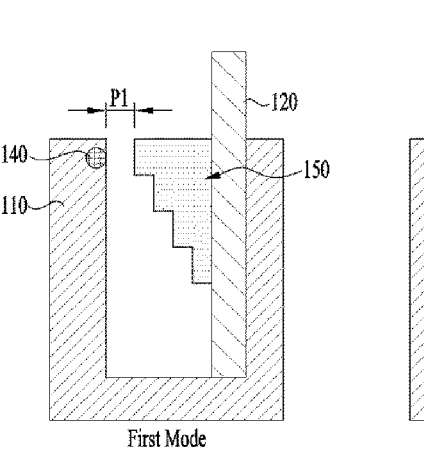
FIG. 8 illustrates the state of the display device in each mode according to the fourth embodiment of the present disclosure.
Figure 8:
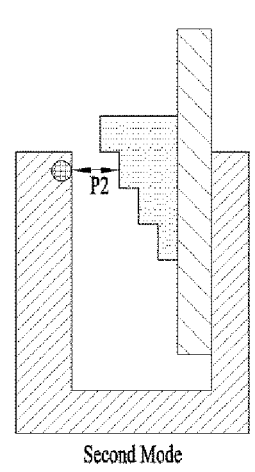
Figure 8:
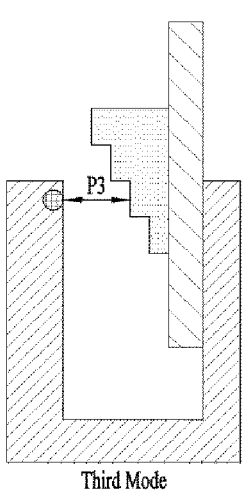
Figure 8:
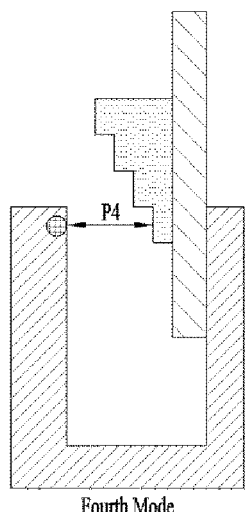

FIG. 7 illustrates the state of the display device in each mode according to the third embodiment of the present disclosure. FIG. 8 illustrates the state of the display device in each mode according to the fourth embodiment of the present disclosure.

Referring to FIG. 7, the display 120 is least exposed in the first mode and is most exposed in the fourth mode.

The sensor 140 is connected to the rear surface of the display 120, and the mode control structure 150 is disposed on the inner wall of the casing 110, facing the rear surface of the display 120. The sensor 140 measures the distance between the rear surface of the display 120 and the mode control structure 150.

When the value measured by the sensor 140 is L1, the withdrawal mode of the display 120 is the first mode. When the value measured by the sensor 140 is L2, the withdrawal mode of the display 120 is the second mode. When the value measured by the sensor 140 is L3, the withdrawal mode of the display 120 is the third mode. When the value measured by the sensor 140 is L4, the withdrawal mode of the display 120 is the fourth mode.

The display device may receive a withdrawal mode signal initiated or selected by a user, move the display 120 by driving the motor, and stop the motor upon determining that the display 120 is located at a position corresponding to the selected withdrawal mode.

Referring to FIG. 8, the mode control structure 150 is formed on the rear surface of the display 120, and the sensor 140 is connected to the inner wall of the casing 110, facing the rear surface of the display 120. The sensor 140 measures the distance between the inner wall of the casing 110 and the mode control structure 150.

When the value measured by the sensor 140 is P1, the withdrawal mode of the display 120 is the first mode. When the value measured by the sensor 140 is P2, the withdrawal mode of the display 120 is the second mode. When the value measured by the sensor 140 is P3, the withdrawal mode of the display 120 is the third mode. When the value measured by the sensor 140 is P4, the withdrawal mode of the display 120 is the fourth mode.

A matching relationship between the value measured by the sensor 140 and the withdrawal mode may be changed and applied as desired by a person skilled in the art.

Figure 9:
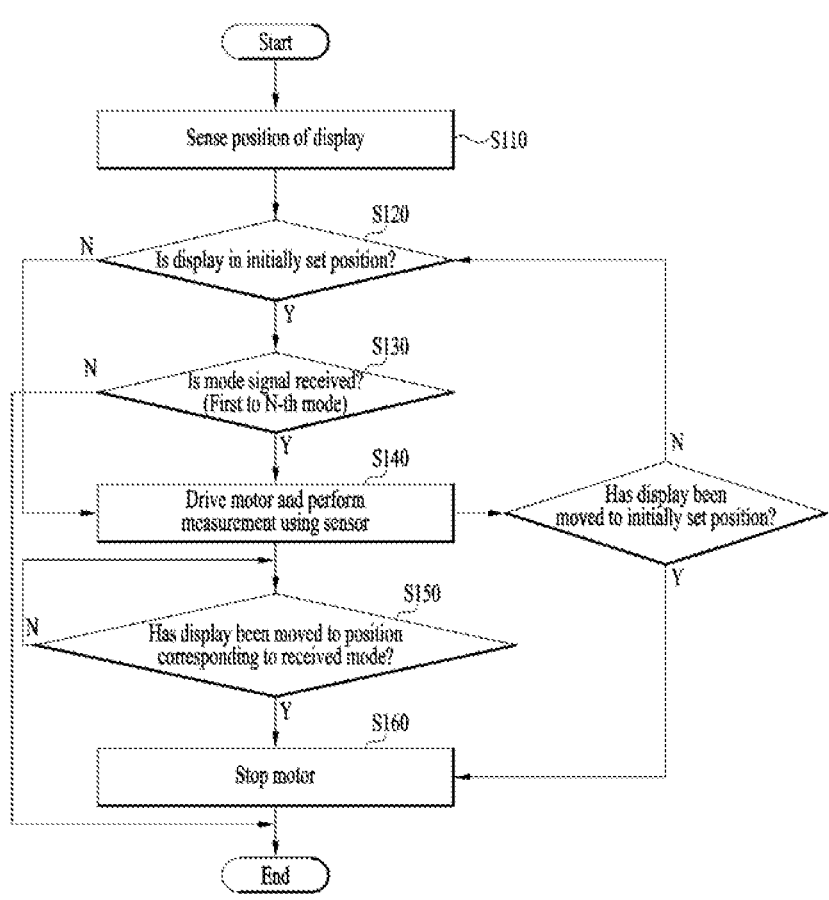
FIG. 9 illustrates a control method for a display device according to an embodiment of the present disclosure.

FIG. 9 illustrates a control method for a display device according to an embodiment of the present disclosure (referred to hereinafter as a "control method").

Specifically, FIG. 9 illustrates a control method for the display device according to the above-described embodiments.

Referring to FIG. 9, the control method includes sensing a position of the display (S110), checking whether the display is in an initially set position (S120), receiving a mode signal according to selection of a user (S130), driving the motor to move the display and measuring movement of the display using a sensor (S140), checking the movement of the display (S150), and/or stopping the motor (S160).

S110 is an operation of detecting a current position of the display based on a value measured by the sensor 140. For example, in FIG. 7, when the value measured by the sensor 140 is L2, the display 120 is determined to be currently in the second mode.

S120 is an operation of checking whether the display 120 is in the initially set position. For example, when the initially set position of the display 120 corresponds to the third mode, it is checked whether the display 120 is in the third mode. When a current withdrawal mode of the display 120 is the second mode, the display device may drive the motor (S140) to move the display 120 to the initially set position because the second mode is different from the initially set position.

When the display 120 is in the initially set position in S120, the display device receives a withdrawal mode signal initiated or selected by the user (S130). When the initially set position corresponds to the third mode and the withdrawal mode selected by the user is the fourth mode, the display device may drive the motor (S140) to move the display 120 to a position corresponding to the fourth mode. While the display 120 is moving, measurement is performed using sensor 140 (S140), and it may be checked whether the display 120 has been moved to a position corresponding to the input withdrawal mode based on the value measured by the sensor 140 (S150).

S160 is an operation of stopping the motor after it is determined that the display 120 has been moved to the selected withdrawal mode.

The control method according to embodiments may include all the above-described operations or exclude some of the operations. For example, the control method may include sensing a current mode of the display (S110) based on the value measured by the sensor, receiving a mode signal selected by a user (S130), driving the motor according to the received mode signal to move the display 120, and checking whether the display 120 has been moved according to the received mode signal based on the value measured by the sensor 14 while the display 120 moves (S150). The control method according to the embodiments may be performed by an integrated controller (or head unit) of a vehicle or a controller (not illustrated) of the display device. The controller (not illustrated) may be configured by software, hardware, or a combination thereof.

In the control method according to the embodiment, a driving direction of the motor may be selected by comparing information about the withdrawal mode selected by the user with information about a current mode. For example, when the current mode is the first mode and the withdrawal mode selected by the user is the fourth mode, the motor of the display device may be driven in a specific direction to move the display 120 to a position corresponding to the fourth mode. Conversely, when the current mode is the fourth mode and the withdrawal mode selected by the user is the first mode, the motor of the display device may be driven in a direction opposite to the above-described direction to move the display 120 to a position corresponding to the first mode. The control method may further include comparing, before driving the motor (S140), the received withdrawal mode with the current mode.

Figure 10:
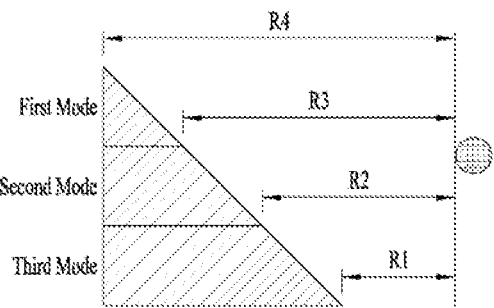
FIG. 10 illustrates a mode control structure according to an embodiment of the present disclosure.

FIG. 10 illustrates a mode control structure according to an embodiment of the present disclosure.

Referring to FIG. 10, the illustrated mode control structure has a shape having planes whose distances to the sensor continuously change. The mode control structure of FIG. 10 may be applied instead of the mode control structure 150 of the display device according to the third or fourth embodiment described above.

Referring to FIG. 10, when the value measured by the sensor is in the range of R3 to R4, the display 120 corresponds to the third mode. When the value measured by the sensor is in the range of R2 to R3, the display 120 corresponds to the second mode. When the value measured by the sensor is in the range of R1 to R2, the display 120 corresponds to the first mode. That is, when there are ranges of measured values corresponding to respective withdrawal modes, and the value measured by the sensor is in a measured value range of a specific withdrawal mode, the display 120 may be determined to be in a corresponding withdrawal mode.

In the display device to which the mode control structure of FIG. 10 is applied, the display 120 may be withdrawn according to a plurality of withdrawal modes having different withdrawal ranges. The withdrawal modes may correspond to ranges of values measured by the sensor 140, and a withdrawal mode of the display may be determined based on the value measured by the sensor.

The display device and control method therefor according to the above-described embodiments may be applied to a vehicle. For example, the display device may be mounted or provided on a center fascia or dashboard of the vehicle.

The display device according to embodiments may measure, using the sensor 140, the distance between the display 120 and the casing 110, which changes according to the withdrawal of the display 120 from the casing 110, and control the withdrawal range of the display 120 by checking the degree of withdrawal of the display 120 based on the value measured by the sensor 140.

According to the embodiments of the present disclosure, the withdrawal range of the display may be efficiently controlled according to the usage of the display screen, and therefore utilization of the display is improved. In addition, only a display area of a withdrawn range may be used for output, and therefore power required for screen display may be reduced. Furthermore, the position of the display may be controlled to a more precise degree than when the position of the display is controlled only with the motor.

The description of various embodiments of the present disclosure is not limited to the corresponding embodiments, and it is understood that the technical idea of each embodiment applied in various embodiments may be applied even to other embodiments.

As described above, the detailed description of the embodiments of the present disclosure has been given to enable those skilled in the art to implement and practice the disclosure. Although the disclosure has been described with reference to the embodiments, those skilled in the art will appreciate that various modifications and variations may be made in the present disclosure without departing from the spirit or scope of the disclosure and the appended claims. For example, those skilled in the art may use constructions disclosed in the above-described embodiments in combination with each other.

Accordingly, the present disclosure should not be limited to the specific embodiments described herein, but should be accorded the broadest scope consistent with the principles and features disclosed herein.

What is claimed is:

1. A display device, comprising:
a casing having an opening;
a display configured to be inserted into or withdrawn from the casing through the opening;
a motor gear assembly connected to move the display; and
a sensor configured to measure a distance between the display and an inner wall of the casing,
wherein the sensor measures the distance in a direction perpendicular to a movement direction of the display, and
wherein movement of the display is controlled based on values measured by the sensor.

2. The display device of claim 1, wherein the sensor is disposed on the display and measures a distance to one point on the inner wall of the casing in a direction parallel to a movement direction of the display.

3. The display device of claim 1, wherein the sensor is disposed on the inner wall of the casing and measures a distance to one point on the display in a direction parallel to a movement direction of the display.

4. The display device of claim 1, wherein the display is withdrawable from the casing according to a plurality of withdrawal modes, each withdrawal mode corresponding to a range of the values measured by the sensor, respectively, and a withdrawal mode of the display is determined based on the values measured by the sensor.

5. The display device of claim 1, further comprising a controller programmed for:
checking a position of the display based on the values measured by the sensor;
receiving a mode signal initiated by a user;
driving a motor of the motor gear assembly based on the mode signal initiated by the user; and
determining whether the display has been moved according to the mode signal initiated by the user based on the values measured by the sensor.

6. The display device of claim 1, wherein the sensor is disposed on a rear surface of the display and configured to measure the distance in a direction perpendicular to a movement direction of the display, the inner wall of the casing includes a mode control structure having a shape along which a horizontal distance to the sensor changes in the movement direction of the display, and the sensor is configured to measure a distance between the rear surface of the display and the mode control structure.

7. The display device of claim 6, wherein the display is withdrawable from the casing according to a plurality of withdrawal modes having different withdrawal ranges, the plurality of withdrawal modes corresponding to values measured by the sensor, respectively, and a withdrawal mode of the display is determinable based on the values measured by the sensor.

8. The display device of claim 1, wherein the sensor is disposed on the inner wall of the casing and measures the distance in a direction perpendicular to a movement direction of the display, a rear surface of the display includes a mode control structure having a shape along which a horizontal distance to the sensor changes with the movement direction of the display, and the sensor is configured to measure a distance between the inner wall of the casing and the mode control structure.

9. The display device of claim 8, wherein the display is withdrawable from the casing according to a plurality of withdrawal modes having different withdrawal ranges, the plurality of withdrawal modes corresponding to values measured by the sensor, respectively, and a withdrawal mode of the display is determinable based on the values measured by the sensor.

10. The display device of claim 1, wherein the sensor is disposed on a rear surface of the display and measures the distance in a direction perpendicular to a movement direction of the display, the inner wall of the casing includes a mode control structure having a shape along which a horizontal distance to the sensor continuously changes during movement of the display in the movement direction of the display, and the sensor is configured to measure a distance between the rear surface of the display and the mode control structure.

11. The display device of claim 10, wherein the display is withdrawable from a casing according to a plurality of withdrawal modes having different withdrawal ranges, the plurality of withdrawal modes each corresponding to a range of values measured by the sensor, respectively, and a withdrawal mode of the display is determinable based on the values measured by the sensor.

12. The display device of claim 1, wherein the sensor is disposed on the inner wall of the casing and measures the distance in a direction perpendicular to a movement direction of the display, a rear surface of the display includes a mode control structure having a shape along which a horizontal distance to the sensor continuously changes during movement of the display in the movement direction of the display, and the sensor is configured to measure a distance between the inner wall of the casing and the mode control structure.

13. The display device of claim 12, wherein the display is withdrawable from a casing according to a plurality of withdrawal modes having different withdrawal ranges, the plural withdrawal modes each corresponding to a range of values measured by the sensor, respectively, and a withdrawal mode of the display is determined based on the values measured by the sensor.

14. A vehicle including the display device of claim 1, wherein the display device is mounted on a center fascia or a dashboard of the vehicle.

15. A display device, comprising:
a casing having an opening;
a display structure comprising a display that is configured to be extended from or retracted into the casing through the opening;
a motor gear assembly connected to move the display structure; and
a sensor configured to measure a lateral distance between the display structure and an inner wall of the casing;
wherein the distance changes according to withdrawal of the display structure from the casing, and
wherein the display device is configured to measure a withdrawal range of the display structure by checking a degree of withdrawal of the display based on a value measured by the sensor.

16. A method of operating a display device with a retractable display, the display device comprising a casing having an opening with the retractable display configured to be inserted into or withdrawn from the casing through the opening by operation of a motor gear assembly, the display device further comprising a sensor configured and arranged to measure a distance between the display and an inner wall of the casing, the method comprising:
checking a position of the display based on values measured by the sensor;
receiving a mode signal initiated by a user;
driving a motor of the motor gear assembly based on the mode signal initiated by the user; and
determining whether the display has been moved according to the mode signal by the user based on values measured by the sensor;
wherein checking the position of the display based on values measured by the sensor comprising measuring, with the sensor, a distance between the sensor and a mode control structure, wherein the mode control structure has a shape that varies along a movement direction of the display.

17. The method of claim 16, wherein the mode control structure is disposed on the inner wall of the casing and the sensor is disposed on the display.

18. The method of claim 16, wherein the mode control structure is disposed on the display and the sensor is disposed on the inner wall of the casing.

19. The method of claim 16, further comprising reducing energy consumption by operating only a portion of the display that extends outside the casing.

* * * * *